United States Patent
Assefa et al.

(10) Patent No.: US 9,136,303 B2
(45) Date of Patent: Sep. 15, 2015

(54) CMOS PROTECTION DURING GERMANIUM PHOTODETECTOR PROCESSING

(71) Applicant: International Business Machines Corporation, Armonk, NY (US)

(72) Inventors: Solomon Assefa, Ossining, NY (US); Marwan H. Khater, Astoria, NY (US); Edward W. Kiewra, South Burlington, VT (US); Carol Reinholm, Essex Junction, VT (US); Steven M. Shank, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 92 days.

(21) Appl. No.: 13/970,754

(22) Filed: Aug. 20, 2013

(65) Prior Publication Data

US 2015/0054041 A1 Feb. 26, 2015

(51) Int. Cl.
*H01L 27/146* (2006.01)
*H01L 27/144* (2006.01)

(52) U.S. Cl.
CPC ...... *H01L 27/14689* (2013.01); *H01L 27/1443* (2013.01)

(58) Field of Classification Search
CPC .................. H01L 27/146; H01L 27/14689
USPC .................... 438/59, 200, 752, 933
See application file for complete search history.

(56) References Cited

U.S. PATENT DOCUMENTS

| | | | |
|---|---|---|---|
| 6,905,615 B2 * | 6/2005 | Fischer et al. | 216/2 |
| 7,157,300 B2 * | 1/2007 | Lee et al. | 438/59 |
| 7,220,632 B2 * | 5/2007 | Jones | 438/199 |
| 7,262,117 B1 * | 8/2007 | Gunn et al. | 438/481 |
| 2002/0119589 A1 * | 8/2002 | Fischer et al. | 438/48 |
| 2006/0189050 A1 * | 8/2006 | Jones | 438/154 |
| 2011/0027950 A1 * | 2/2011 | Jones et al. | 438/155 |
| 2012/0129302 A1 * | 5/2012 | Assefa et al. | 438/154 |
| 2014/0217480 A1 * | 8/2014 | Kronholz et al. | 257/288 |
| 2014/0355636 A1 * | 12/2014 | Okumura et al. | 372/45.011 |
| 2015/0054041 A1 * | 2/2015 | Assefa et al. | 257/290 |

FOREIGN PATENT DOCUMENTS

| | | |
|---|---|---|
| WO | 2005083750 | 9/2005 |
| WO | 2012080740 | 6/2012 |
| WO | 2012085593 | 6/2012 |

* cited by examiner

*Primary Examiner* — Earl Taylor
(74) *Attorney, Agent, or Firm* — Michael J. LeStrange; Roberts Mlotkowski Safran & Cole, P.C.

(57) ABSTRACT

A method of protecting a CMOS device within an integrated photonic semiconductor structure is provided. The method may include depositing a conformal layer of germanium over the CMOS device and an adjacent area to the CMOS device, depositing a conformal layer of dielectric hardmask over the germanium, and forming, using a mask level, a patterned layer of photoresist for covering the CMOS device and a photonic device formation region within the adjacent area. Openings are etched into areas of the deposited layer of silicon nitride not covered by the patterned photoresist, such that the areas are adjacent to the photonic device formation region. The germanium material is then etched from the conformal layer of germanium at a location underlying the etched openings for forming the photonic device at the photonic device formation region. The conformal layer of germanium deposited over the CMOS device protects the CMOS device.

13 Claims, 7 Drawing Sheets

CMOS PROTECTION DURING GERMANIUM PHOTODETECTOR PROCESSING

BACKGROUND a. Field of the Invention

The present invention generally relates to semiconductor devices, and particularly to integrated CMOS photonic semiconductor devices.

b. Background of Invention

The use of both photonic devices in high-speed switching and transceiver devices in data communications are but a few examples that highlight the advantages of processing both optical and electrical signals within a single integrated device. For example, an integrated photonic device may include both photodetector and CMOS type devices that may be fabricated on a single silicon substrate. However, during the fabrication process, certain processes, while benefiting or being necessary for the formation and/or operation of one type of device (e.g., Photodetector), may be detrimental to the formation and/or operation of the other type of device (e.g., CMOS Field Effect Transistor (FET) Structures).

BRIEF SUMMARY

According to one or more embodiments, it may be advantageous, among other things, to maintain, within an integrated photonic device, the integrity of both photonic and non-photonic type devices during fabrication processes.

According to at least one exemplary embodiment, a method of protecting a CMOS device during the formation of a photonic device within an integrated photonic semiconductor structure is provided. The method may include depositing a conformal layer of germanium over the CMOS device and over an adjacent area to the CMOS device, depositing a conformal layer of dielectric hardmask over the layer of germanium, and forming, using a first mask level, a first patterned layer of photoresist for covering the CMOS device and covering a photonic device formation region within the adjacent area. Openings are then etched into areas of the deposited layer of dielectric hardmask not covered by the first patterned layer of photoresist, such that the areas are adjacent to the photonic device formation region. Following the removing of the first pattered layer of photoresist, germanium material is etched from the conformal layer of germanium at a location underlying the etched openings for forming the photonic device at the photonic device formation region. The conformal layer of germanium deposited over the CMOS device protects the CMOS device.

According to at least one other exemplary embodiment, an integrated photonic semiconductor structure may include a substrate, a photonic device having a germanium active region located on a first region of the substrate, a CMOS device located on a second region of the substrate and electrically isolated from the photonic device such that the first region is adjacent to the second region, and a layer of germanium located over the CMOS device, whereby the layer of germanium protects the underlying CMOS device during the formation of the germanium active region. The layer of germanium and the germanium active region are formed from a conformally deposited germanium layer. Also, the integrated photonic semiconductor structure may include a dielectric stack layer located over the germanium active region for encapsulating the germanium active region, such that the layer of germanium protects the underlying CMOS device during the formation of the dielectric stack layer.

According to at least one other exemplary embodiment, a design structure tangibly embodied in a machine readable medium for designing, manufacturing, or testing an integrated circuit may be provided. The design structure may include a substrate, a photonic device having a germanium active region located on a first region of the substrate, a CMOS device located on a second region of the substrate and electrically isolated from the photonic device such that the first region is adjacent to the second region, and a layer of germanium located over the CMOS device, whereby the layer of germanium protects the underlying CMOS device during the formation of the germanium active region. The layer of germanium and the germanium active region are formed from a conformally deposited germanium layer. Also, the integrated photonic semiconductor structure may include a dielectric stack layer located over the germanium active region for encapsulating the germanium active region, such that the layer of germanium protects the underlying CMOS device during the formation of the dielectric stack layer.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following structure and processes provide exemplary embodiments of a CMOS integrated nanophotonics device that includes, for example, both a photonic device such as a germanium (Ge) photodetector and CMOS structures such FET gate structures. Within CMOS integrated nanophotonic circuits, crystalline materials such as germanium or III-V compounds may be utilized as an active element of the photodetector component based on their high quantum efficiency. Using a rapid melt growth technique, Ge films can be deposited at low temperatures in an amorphous state using techniques such as physical vapor deposition (PVD), plasma enhanced chemical vapor deposition (PECVD), and rapid thermal chemical vapor deposition (RTCVD), and subsequently crystallized thermally.

However, during Ge layer deposition for forming an active region of the photodetector device, adjacent CMOS FET gate structures may also be covered by the deposited Ge layer. Removal of the Ge layer from over these FET gate structures during a subsequent Ge photodetector formation process (i.e., at a Ge mask level) may in turn damage these gate structures. This may occur as a result of the over etching (e.g., RIE etching) that may be required to remove residual Ge material from the spaces between the FET gate structures. Specifically, in addition to removing the Ge, the over etching may undesirably damage the FET gate spacers on the sidewalls of the gate structures.

Additionally, subsequent processes may include the deposition of a multilayer dielectric stack over the formed Ge photodetector and the CMOS gate structures, whereby the multilayer dielectric stack may be deposited to encapsulate the Ge photodetector. Thus, another etch process may be needed (i.e., at a dielectric mask layer) to remove the remaining multilayer dielectric stack deposited over the CMOS gate structures. As with the above process, the etching of the remaining multilayer dielectric stack deposited over the CMOS gate structures may cause damage to the FET gate spacers as a result of inadequate etch selectivity between the dielectric stack (i.e., nitride & oxide layers) and the silicon nitride material forming the spacers. Also, in the spaces between these CMOS gate structures, the etch process may eat into the active silicon region over which the gate structures are formed.

However, the one or more embodiments described and illustrated below provide processing that mitigates the byproducts of such over etching by using the deposited Ge layer that is used in the formation of the photodetector to also protect the adjacent CMOS FET gate structures. FIGS. 1A-1F are vertical cross-sectional views of an integrated photonic semiconductor device structure during the formation of a Germanium (Ge) layer of a photodetector that protects adjacent CMOS devices according to one or more exemplary embodiments.

Figure 1A:
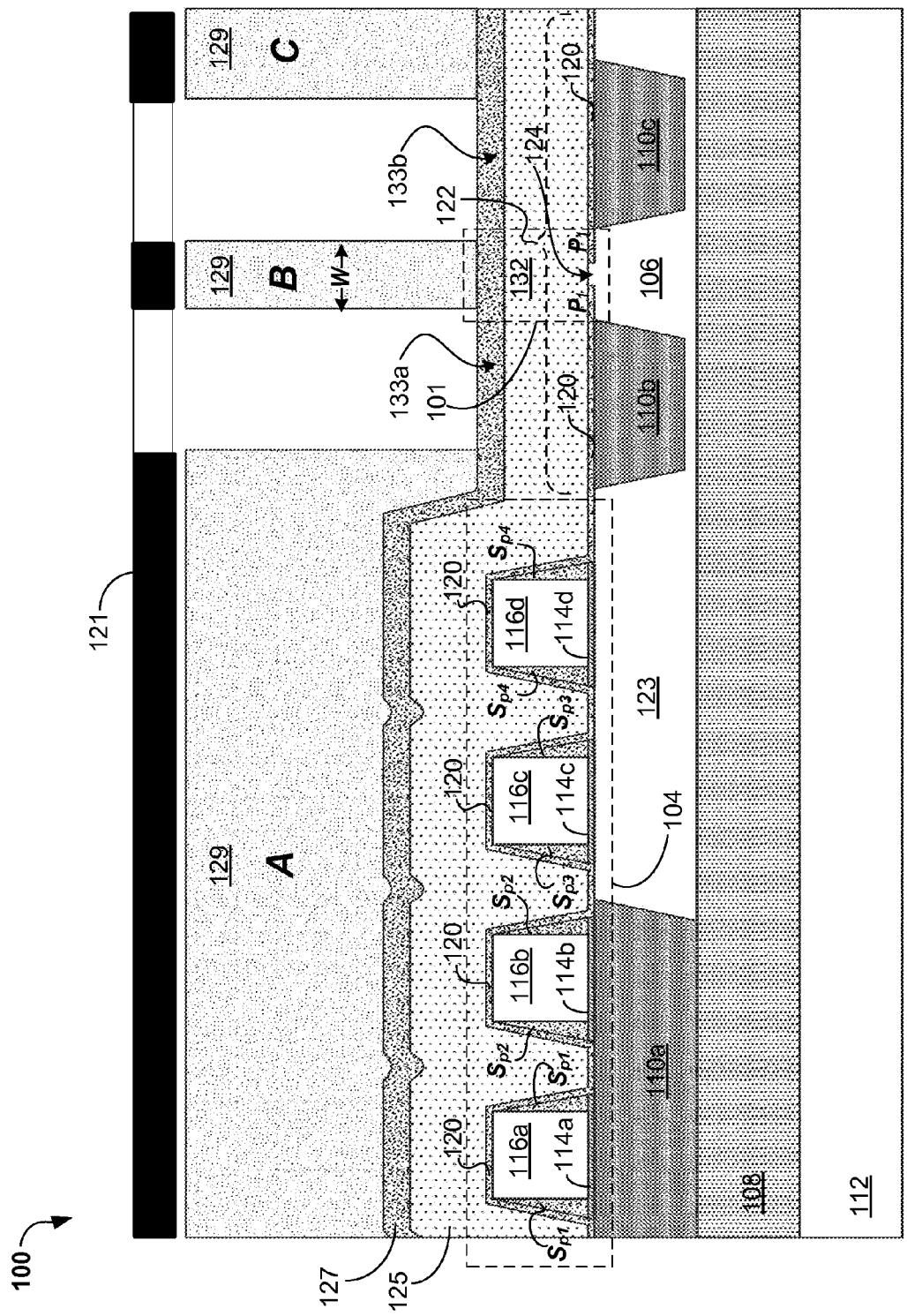
FIGS. 1A-1F are vertical cross-sectional views of an integrated photonic semiconductor device structure during the formation of a Germanium (Ge) layer of a photodetector that protects adjacent CMOS devices according to one or more exemplary embodiments.

Referring to FIG. 1A, an integrated photonic semiconductor structure 100 is illustrated. The integrated photonic semiconductor structure 100 may include a photonic device formation region 101 for fabricating, for example, a Germanium (GE) photodetector (FIG. 1F: photodetector 102) and CMOS devices such as FET gate structures 104.

The integrated photonic semiconductor structure 100 may further include an optical waveguide structure 106, a buried oxide (BOX) region 108, shallow trench and partial shallow trench isolation (STI) regions 110a-110c, and a silicon substrate 112. The BOX region 108 is located over the silicon substrate 112. The optical waveguide structure 106 may be formed within a silicon-on-insulator (SOI) layer (not shown) of structure 100, whereby the partial STI regions 110b-110c and BOX region 108 surrounding the waveguide 106 facilitate optical confinement (i.e., cladding) and low-loss waveguiding. As depicted, the formed CMOS FET gate structures 104 may include gate dielectrics 114a-114d, polysilicon gate electrodes 116a-116d, and gate spacers $S_{p1}$-$S_{p4}$.

As further depicted in FIG. 1A, a layer of silicon nitride 120 having a thickness of about 400 Å is deposited over both the CMOS FET gate structures 104 and region 122, which includes the photonic device formation region 101. The portions of the layer of silicon nitride 120 located over the top surfaces of the CMOS FET gate structures 104 may act as etch stop layers. Also, opening 124 is formed within the layer of silicon nitride 120 located within the photonic device formation region 101.

A conformal layer of Ge 125 having a thickness of about 1500 Angstroms (Å) is deposited over both the CMOS FET gate structures 104 and region 122, which includes the photonic device formation region 101. It may be appreciated that Ge layer 125 thicknesses in the range of about 500-3000 Å may also be contemplated. Also a dielectric hardmask layer such as a silicon nitride hardmask layer 127 having a thickness of about 600 Å is deposited over the conformally deposited layer of Ge 125. It may be appreciated that silicon nitride hardmask layer 127 thicknesses in the range of about 250-1000 Å may also be contemplated. As illustrated, a 1 micrometer (μm) thick layer of pattered photoresist 129 is created over the silicon nitride hardmask layer 127 using a first mask level 121, whereby region A of photoresist 129 covers (i.e., protects) the CMOS FET gate structures 104, region B of photoresist 129 covers (i.e., protects) the photonic device formation region 101, and region C of photoresist 129 illustrates a partial covering (i.e., protecting) of other adjacent structures (not shown) such as other CMOS FET gate structures associated with the integrated photonic semiconductor structure 100.

The opening 124 within the 400 Å layer of silicon nitride 120 enables Ge active region 132 located under region B of photoresist 129 to utilize the silicon material of optical waveguide 106 as a seed layer during subsequent crystallization processes. However, as illustrated, the remaining portions $P_1$ of the Ge active region 132 may be isolated from the silicon optical waveguide 106 by the deposited layer of silicon nitride 120. Specifically, the isolation between the remaining portions $P_1$ of the Ge active region 132 and the silicon optical waveguide 106 may facilitate the avoidance of the intermixing of germanium from the Ge active region 132 with the silicon of the optical waveguide 106. For example, one effect of such intermixing would be to reduce the responsivity of the Ge active region 132 and consequently the formed photodetector 102 (FIG. 1F).

Figure 1B:
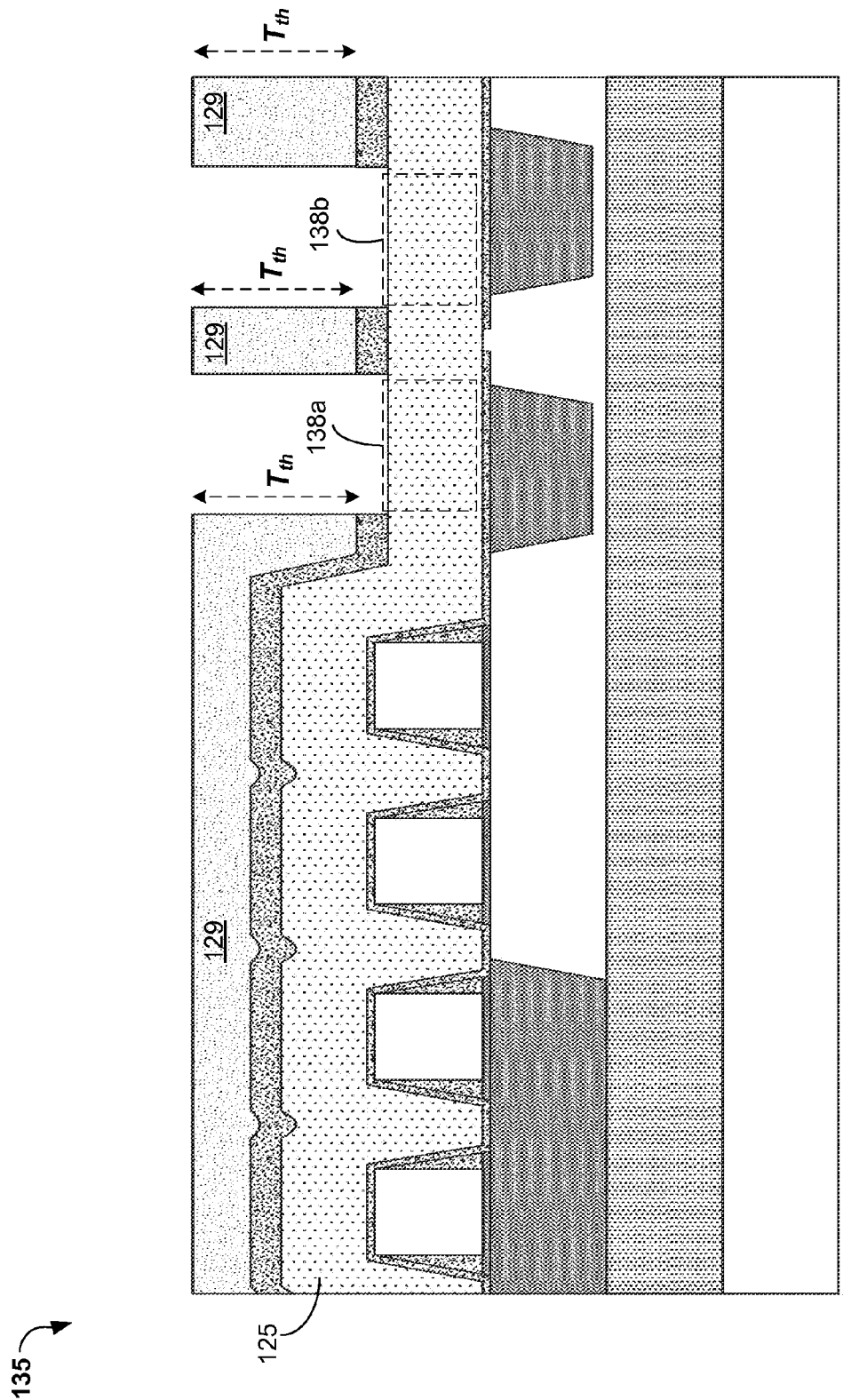

Referring to FIG. 1B, integrated photonic device structure 135 may be formed by the reactive ion etching (RIE) of portions 133a (FIG. 1A) and 133b (FIG. 1A) of the silicon nitride hardmask layer 127 (FIG. 1A) of integrated photonic device structure 100 (FIG. 1A). Thus, portions 133a (FIG. 1A) and 133b (FIG. 1A) that are not protected by the regions A, B, C (FIG. 1A) of the photoresist 129 (FIG. 1A) are accordingly etched away, exposing Ge regions 138a and 138b of the Ge layer 125. The etching of portions 133a (FIG. 1A) and 133b (FIG. 1A) of the silicon nitride hardmask mask layer 127 (FIG. 1A) also removes some of the photoresist 129, as depicted by the reduced thickness $T_{th}$.

Figure 1C:
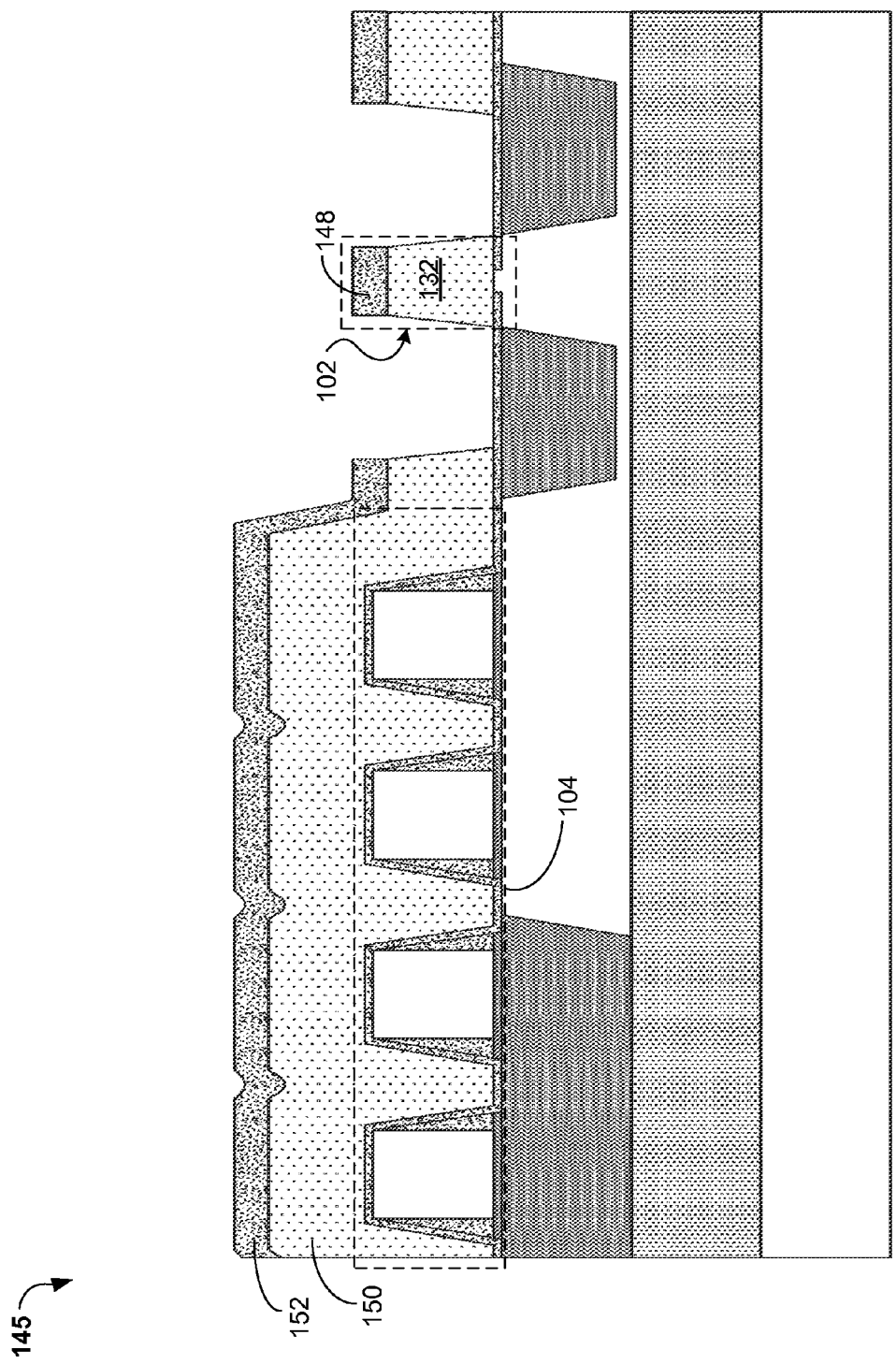

Referring to FIG. 1C, integrated photonic device structure 145 may be formed by etching (e.g., RIE) the exposed Ge regions 138a (FIG. 1B) and 138b (FIG. 1B) of the Ge layer 125 (FIG. 1B). Subsequently, the reduced thickness photoresist 129 (FIG. 1B) is removed. Alternatively, the reduced thickness photoresist 129 (FIG. 1B) may first be removed. Then, the exposed Ge regions 138a (FIG. 1B) and 138b (FIG. 1B) of the Ge layer 125 (FIG. 1B) are etched. In this alternative process, the 600 Å silicon nitride hardmask layer 127 protects the underlying Ge as a result of the Ge etch being selective to the silicon nitride material. Thus, the reduced thickness photoresist 129 (FIG. 1B) can be removed first, followed by Ge regions 138a (FIG. 1B) and 138b (FIG. 1B). As depicted, following the removal of Ge regions 138a (FIG. 1B) and 138b (FIG. 1B), photodetector 102 is formed. Photodetector 102 thus includes active Ge region 132 and cap nitride layer 148 formed from the prior etching of the silicon nitride hardmask layer 127.

As shown in FIG. 1C, Ge region 150 provides a protective layer over the CMOS FET gate structures 104. Also, silicon nitride hardmask region 152 provides an etch stop layer on top of the Ge region 150. Both the protective Ge region 150 and the silicon nitride hardmask region 152 are formed as a result of the patterning of the photoresist 129 using the first mask level 121. Thus, the protective Ge region 150 protectively encapsulates the CMOS FET gate structures 104 during subsequent processing steps corresponding to forming photodetector 102. Moreover, the Ge region 150 protectively encapsulated the CMOS FET gate structures 104 during the current process step involving the forming of the active Ge region 132 and cap nitride layer 148 of photodetector 102 by etching Ge regions 138a (FIG. 1B) and 138b (FIG. 1B). The width of the active Ge region 132 may be in the range of approximately 0.3 μm-0.5 μm, as defined by width W (FIG.

1A) of region B (FIG. 1A) of the photoresist layer 129 (FIG. 1A). The height of the active Ge region 132 is about 1500 Å. It may be appreciated that an active Ge region 132 width W (FIG. 1A) in the range of about 0.1 μm-5.0 μm may also be contemplated.

In contrast with the described embodiments (i.e., FIGS. 1A-1C), some conventional processing implementations may attempt to etch the entire Ge layer portions not protected by region B of the photoresist 129 (FIG. 1A). In such a process step, as previously described, based on the narrow spacing between the CMOS FET gate structures 104, during the Ge material etching, some Ge material remains between the spacing of the CMOS FET gate structures 104. Therefore, in order to remove this residual Ge material (not shown) between the CMOS FET gate structures 104, over etching may be required, whereby the over etching may undesirably etch into the 400 Å layer of silicon nitride 120 (FIG. 1A) and subsequently into an underlying region of silicon active area 123 (FIG. 1A). However, the processes described and illustrated above in relation to FIGS. 1A-1C, alleviate such an occurrence as a result of the protective Ge region 150 (FIG. 1C) protectively encapsulating the CMOS FET gate structures 104 (FIG. 1C).

Figure 1D:
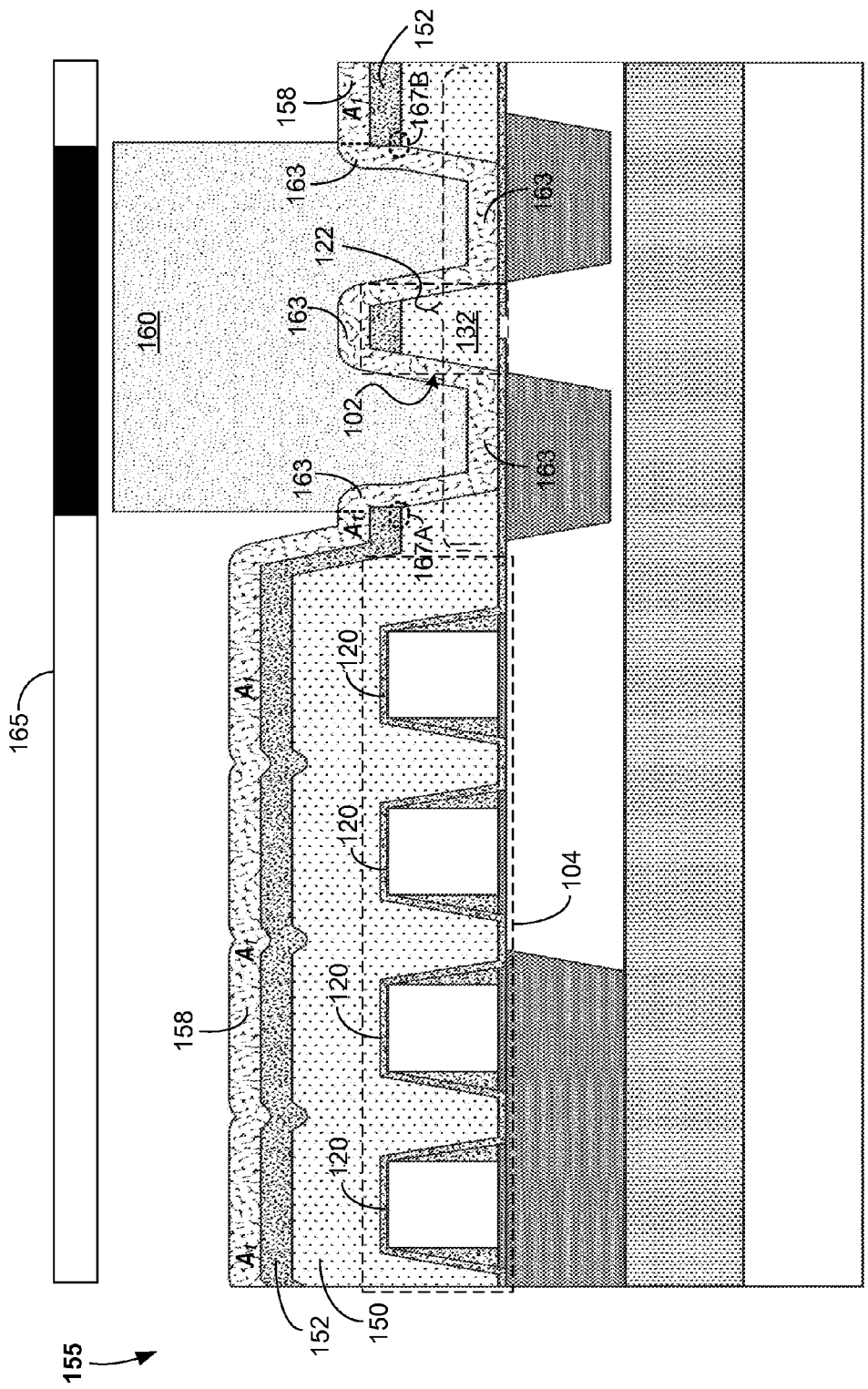

Referring to FIG. 1D, integrated photonic device structure 155 may be formed by depositing a dielectric stack layer 158 over integrated photonic device structure 145 (FIG. 1C). Thus, the dielectric stack layer 158 is deposited over both the CMOS FET gate structures 104 and region 122 (FIG. 1A), which includes formed photodetector 102. The thickness of the dielectric stack layer 158 is approximately 3750 Å and includes, for example, three (3) layers. The first layer may be an oxide material having 1000 Å of thickness and deposited using a chemical vapor deposition (CVD) process. The second layer may be a silicon nitride material having 1700 Å of thickness and deposited using a PECVD process, while the third layer may be a silicon nitride material having 1050 Å of thickness and deposited using a RTCVD process. Although the above described dielectric stack layer 158 includes three (3) layers, any single layer or multilayer structure that includes silicon nitride and/or silicon oxide may be contemplated. Moreover, the thickness of the one or more layers of the dielectric stack may be in the range of about 200-3000 Å.

Integrated photonic device structure 155 also includes a layer of patterned photoresist 160 created over a portion 163 of the deposited dielectric stack layer 158 using a second mask level 165. Portion 163 of the deposited dielectric stack layer 158 is retained using the patterned photoresist 160 in order to encapsulate and protect the formed photodetector 102 during subsequent CMOS processes. As depicted, the patterned photoresist 160 protecting portion 163 of the deposited dielectric stack layer 158 extends in both directions to Ge step regions 167A and 167B. The region not covered by the patterned photoresist 160 is, however, protected by Ge portion 150, which covers the underlying CMOS FET gate structures 104.

Figure 1E:
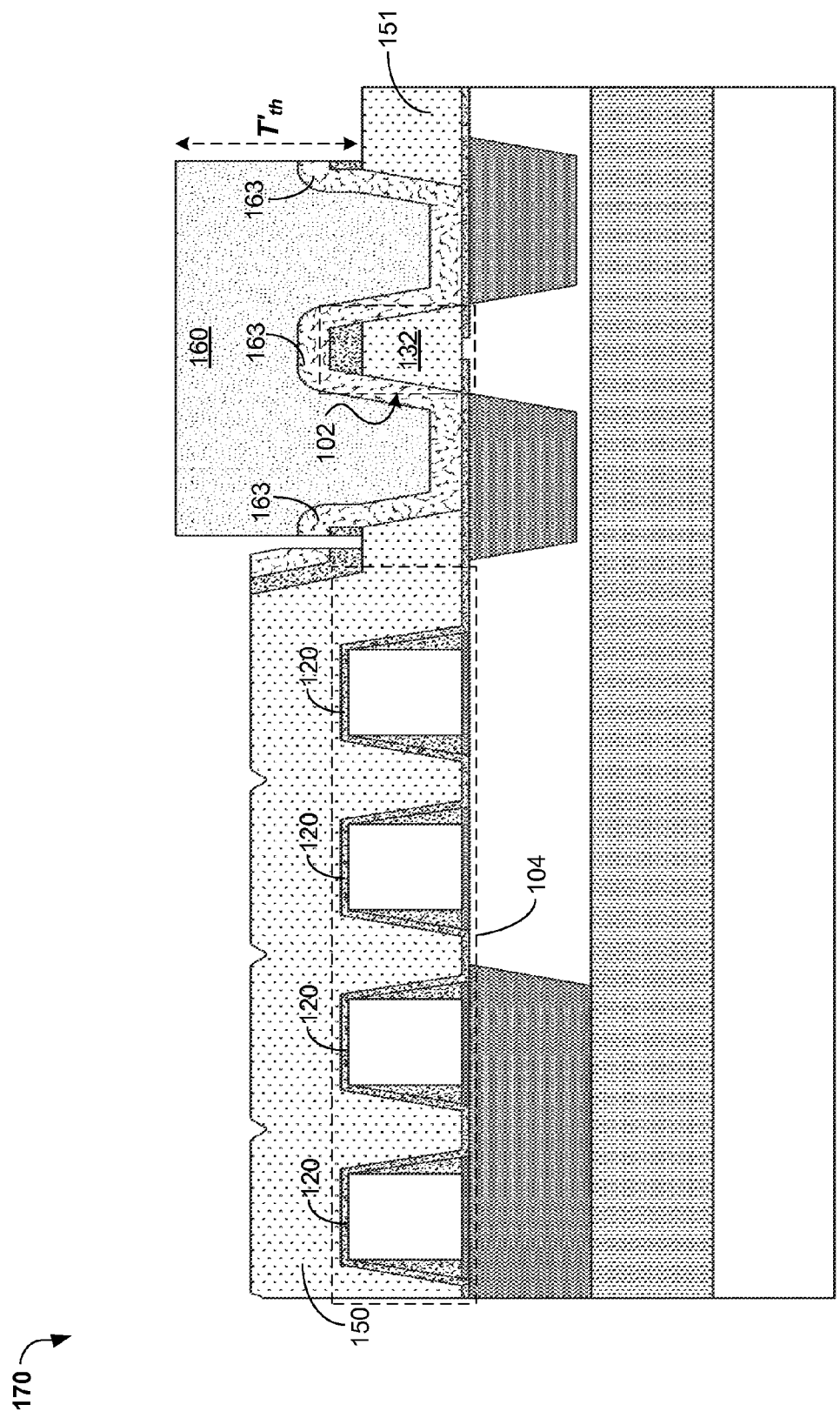
Figure 1F:
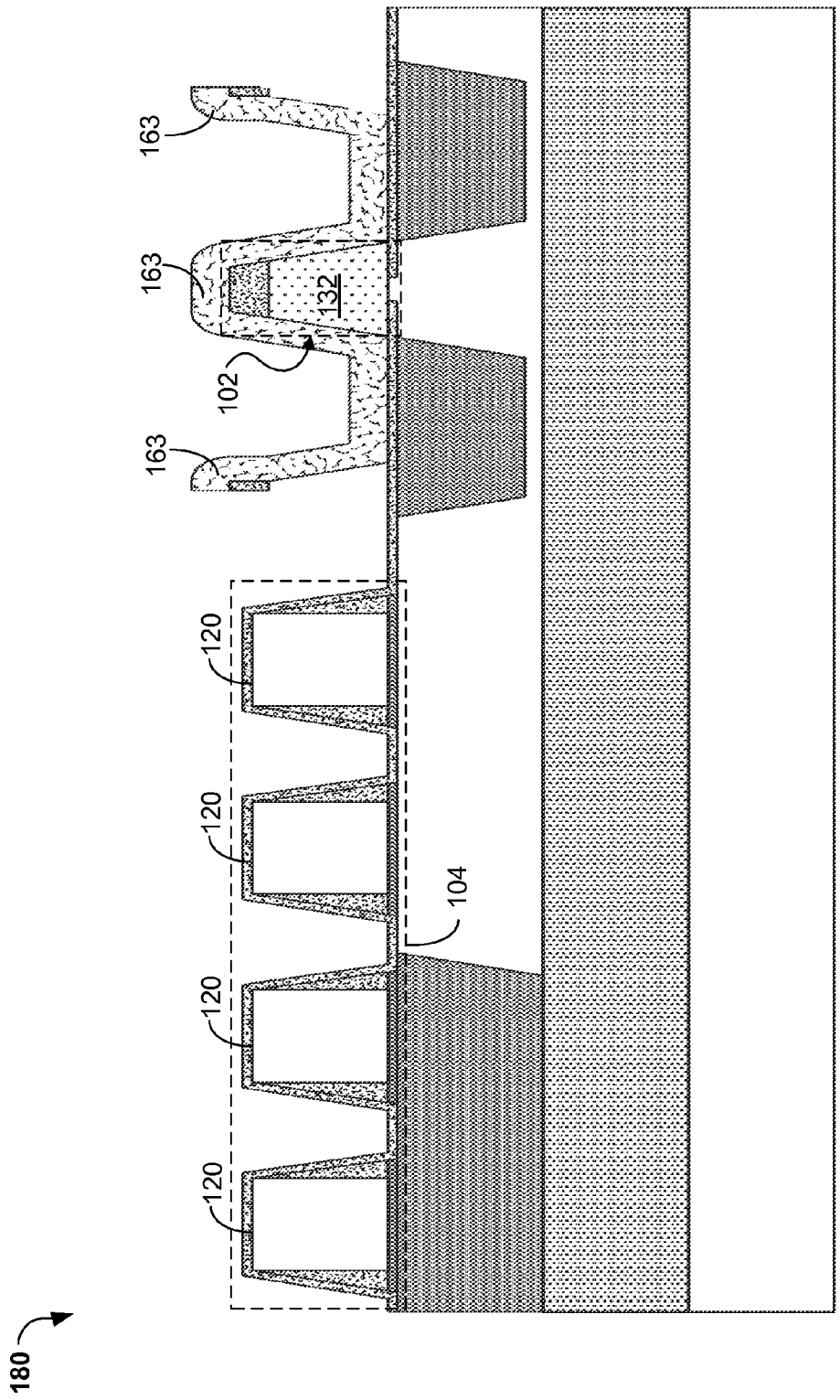

Referring to FIG. 1E, integrated photonic device structure 170 may be formed by etching area $A_1$ (FIG. 1D) of the deposited dielectric stack layer 158 (FIG. 1D) not protected by the patterned photoresist 160 (FIG. 1D) within integrated photonic device structure 155 (FIG. 1D). As depicted, the silicon nitride hardmask region 152 (FIG. 1D) underlying area $A_1$ (FIG. 1D) of the deposited dielectric stack layer 158 (FIG. 1D) is also etched, while the protective Ge region 150 protectively encapsulating the CMOS FET gate structures 104 remains. As a result of the etching (i.e., RIE) of the silicon nitride hardmask region 152 (FIG. 1D) and area $A_1$ (FIG. 1D) of the deposited dielectric stack layer 158 (FIG. 1D), patterned photoresist 160 (FIG. 1D) has a reduced thickness $T'_{th}$.

Since the protective Ge region 150 protectively encapsulating the CMOS FET gate structures 104 remains intact, during the etching of both area $A_1$ (FIG. 1D) of the deposited dielectric stack layer 158 (FIG. 1D) and the underlying silicon nitride hardmask region 152 (FIG. 1D), the CMOS FET gate structures 104 are preserved during this etch process.

Alternatively, if the protective Ge region 150 was not covering the CMOS FET gate structures 104, area $A_1$ (FIG. 1D) of the deposited dielectric stack layer 158 (FIG. 1D) may have typically been deposited directly over (not shown) the CMOS FET gate structures 104. Thus, during the etching of area $A_1$ (FIG. 1D) of the deposited dielectric stack layer 158 (FIG. 1D), certain areas of the CMOS FET gate structures 104 may also have be removed. Because the material composition of the thin layer of 400 Å silicon nitride 120 located over the CMOS FET gate structures 104 is similar to that of the oxide and nitride materials of the deposited dielectric stack layer 158 (FIG. 1D), there is limited etch selectivity. Therefore, the same etch process that strips away the dielectric stack layer 158 (FIG. 1D) may also remove the protective silicon nitride 120 located over the CMOS FET gate structures 104, and subsequently etch into the actual CMOS FET gate structures 104.

In contrast, however, the embodiment of FIG. 1E illustrates the protective Ge region 150 buffering the CMOS FET gate structures 104 from the etching of both area $A_1$ (FIG. 1D) of the dielectric stack layer 158 (FIG. 1D) and the underlying silicon nitride hardmask region 152 (FIG. 1D). Therefore, during the etching of area $A_1$ (FIG. 1D) of the dielectric stack layer 158 (FIG. 1D) and silicon nitride hardmask region 152 (FIG. 1D), any over etching may remove portions of the protective Ge region 150 and not regions of the CMOS FET gate structures 104.

Referring to FIG. 1F, integrated photonic device structure 180 may be formed by removing the reduced thickness photoresist 160 (FIG. 1E), protective Ge region 150 (FIG. 1E), and Ge layer 151 (FIG. 1E) from integrated photonic device structure 170 (FIG. 1E). Once the reduced thickness photoresist 160 (FIG. 1E) is removed, the remaining Ge layers 150, 151 (FIG. 1E) not protected by portion 163 of the deposited dielectric stack layer 158 (FIG. 1D) are etched away. Portion 163 of the deposited dielectric stack layer 158 (FIG. 1D) is an encapsulating layer 163 that protects photodetector 102.

As a result of the complete etch selectivity between the Ge material of the Ge layers 150, 151 (FIG. 1E) and the silicon nitride material of both the encapsulating layer 163 (FIG. 1E) and thin silicon nitride layer 120, a wet etch of integrated photonic device structure 170 (FIG. 1E) may completely remove the Ge material and form integrated photonic device structure 180. As depicted, the encapsulating layer 163 forms a fence-like structure around the photodetector 102. The wet etch of integrated photonic device structure 170 (FIG. 1E) may, for example, include a hydrogen peroxide ($H_2O_2$) wet etch or a Tetramethylammonium Hydroxide (TMAH) wet etch process. Based on the encapsulating layer 163 protecting photodetector 102, a wet etch may be used to affectively remove the remaining Ge layers 150, 151 (FIG. 1E) in contrast to dry etching.

In a conventional process (not shown), since a Ge protective region 150 is not created, any Ge material not utilized to form the active Ge region of the photonic device is etched away. In an attempt to mitigate any damage to the structure of a formed active Ge region, a dry etch (e.g., RIE) is thus used to remove excess Ge material, which as previously described, may lead to the problem of un-removed excess Ge material located between the CMOS gate structures. In the above described embodiments, however, the Ge protective region 150 leading to the formation of the encapsulating layer 163 facilitates the use of a wet etch instead of a dry etch. It is this wet etch process that removes any Ge, especially, excess Ge located between the CMOS gate structures.

The foregoing exemplary embodiments illustrate and describe a process of protecting CMOS gate structures 104 (e.g., FIG. 1F) during the formation of a photodetector 102 (e.g., FIG. 1F) by means of the deposited Ge layer 125 (e.g., FIG. 1B) that is used to form the active region 132 (e.g., FIG. 1F) of the photodetector 102 (e.g., FIG. 1F).

Figure 2:
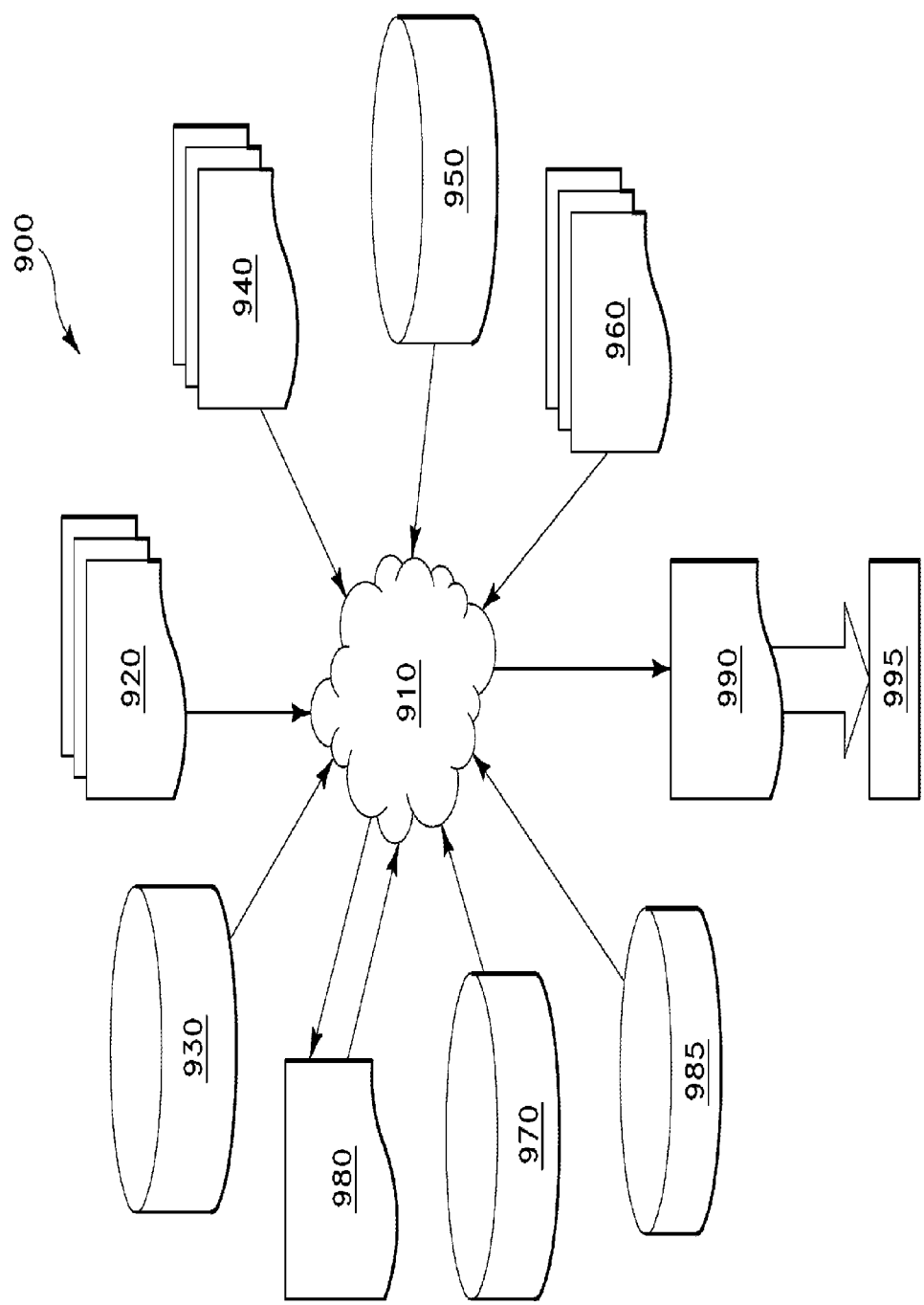
FIG. 2 is a flow diagram of a design process used in semiconductor design, manufacture, and/or test according to an exemplary embodiment.

FIG. 2 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structure and/or device described above and shown in FIG. 1E. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 2 illustrates multiple such design structures including an input design structure 920 that is preferably processed by a design process 910. In one embodiment, the design structure 920 comprises design data used in a design process and comprising information describing the embodiments of the invention with respect to the structure as shown in FIG. 1E. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiments of the invention shown in FIG. 1E. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIG. 1E. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIG. 1E to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiments of the invention shown in FIG. 1E. In one embodiment, design structure 990 may comprise a compiled, executable HDL simulation model that functionally simulates the device shown in FIG. 1E.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIG. 1E. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiments, the practical application or technical improvement over technologies found in the marketplace, or to enable others of ordinary skill in the art to understand the embodiments disclosed herein.

What is claimed is:

1. A method of protecting a CMOS device during the formation of a photonic device within an integrated photonic semiconductor structure, the method comprising:
depositing a conformal layer of germanium over the CMOS device and over an adjacent area to the CMOS device;
depositing a conformal layer of dielectric hardmask over the layer of germanium;
depositing a layer of photoresist over the conformal layer of dielectric hardmask;
applying a first mask level to the layer of photoresist for patterning the layer of photoresist, the patterning of the layer of photoresist forming a first patterned layer of photoresist over the conformal layer of dielectric hardmask, the first patterned layer of photoresist including photoresist for both covering the CMOS device and covering a photonic device formation region within the adjacent area, the first patterned layer of photoresist including opening regions exposing regions of the conformal layer of dielectric hardmask;
etching openings into the exposed regions of the conformal layer of dielectric hardmask, the exposed regions being adjacent to the photonic device formation region;
removing the first patterned layer of photoresist; and
etching germanium material from the conformal layer of germanium at a location corresponding to the exposed regions of the conformal layer of dielectric hardmask, remaining germanium material underlying the photoresist covering the photonic device formation region for creating the photonic device;
wherein the conformal layer of germanium deposited over the CMOS device protects the CMOS device.

2. The method of claim 1, further comprising:
depositing a dielectric stack layer over the CMOS device and over the adjacent area to the CMOS device.

3. The method of claim 2, further comprising:
depositing another layer of photoresist over the dielectric stack layer;
applying a second mask level to the another layer of photoresist for patterning the another layer of photo resist, the patterning of the another layer of photoresist forming a second patterned layer of photoresist over the dielectric stack layer, the second patterned layer of photoresist including a photoresist region for covering the adjacent area to the CMOS device, wherein the photoresist region of the second patterned layer covers both the remaining germanium of the photonic device and a portion of the dielectric stack layer deposited over the photonic device and located within the adjacent area to the CMOS device.

4. The method of claim 3, further comprising:
etching a portion of the dielectric stack layer not covered by the second patterned layer of photoresist; and
etching a portion of the conformal layer of dielectric hardmask not covered by the second patterned layer of photoresist;
wherein, during the etching of the portion of the conformal layer of dielectric hardmask and the etching of the portion of the dielectric stack layer, the conformal layer of germanium deposited over the CMOS device protects the CMOS device from being over-etched.

5. The method of claim 4, further comprising:
removing the second patterned layer of photoresist covering the photonic device, wherein the photonic device includes a germanium region encapsulated by the portion of the dielectric stack layer.

6. The method of claim 5, wherein the germanium region comprises a width of about 0.1-5.0 micrometers.

7. The method of claim 5, further comprising
wet etching the conformal layer of germanium for removing regions of the conformal layer of germanium at locations not covered by the second patterned layer of photoresist.

8. The method of claim 7, wherein the wet etching comprises one of a hydrogen peroxide ($H_2O_2$) wet etch and a Tetramethylammonium Hydroxide (TMAH) wet etch.

9. The method of claim 1, wherein the deposited conformal layer of germanium comprises a thickness of about between 300-3000 Angstroms.

10. The method of claim 1, wherein the conformal layer of dielectric hardmask deposited over the layer of germanium comprises a conformal layer of silicon nitride having a thickness of about 250-1000 Angstroms.

11. The method of claim 2, wherein the dielectric stack layer comprises:
a first silicon nitride layer having a thickness in the range of about 200-3000 Angstroms;
a second silicon nitride layer having a thickness in the range of about 200-3000Angstroms; and
an oxide layer having a thickness in the range of about 200-3000 Angstroms.

12. The method of claim 1, wherein the photonic device comprises a germanium photodetector.

13. The method of claim 1, wherein the CMOS device comprises a plurality of CMOS gate structures.

\* \* \* \* \*